(12) United States Patent
Gao

(10) Patent No.: US 11,729,946 B2
(45) Date of Patent: Aug. 15, 2023

(54) ELECTRONICS RACK WITH LEAK SEGREGATION SYSTEM

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 78 days.

(21) Appl. No.: 17/463,215

(22) Filed: Aug. 31, 2021

(65) Prior Publication Data

US 2023/0067321 A1 Mar. 2, 2023

(51) Int. Cl.
*H05K 7/20* (2006.01)
*G01M 3/04* (2006.01)

(52) U.S. Cl.
CPC .......... *H05K 7/20272* (2013.01); *G01M 3/04* (2013.01); *H05K 7/20781* (2013.01)

(58) Field of Classification Search
None
See application file for complete search history.

(56) References Cited

U.S. PATENT DOCUMENTS

| | | | | |
|---|---|---|---|---|
| 10,098,258 B2 * | 10/2018 | Chainer | ............. | H05K 7/20781 |
| 10,206,312 B2 * | 2/2019 | Shelnutt | ............... | H05K 7/2079 |
| 10,638,645 B1 * | 4/2020 | Moen | .................... | G21C 15/182 |
| 11,212,943 B2 * | 12/2021 | Heydari | ............... | H05K 7/1488 |
| 2011/0313576 A1 * | 12/2011 | Nicewonger | ...... | H05K 7/20781 |
| | | | | 361/701 |
| 2014/0251583 A1 * | 9/2014 | Eriksen | ............. | H05K 7/20772 |
| | | | | 165/104.33 |
| 2022/0039291 A1 * | 2/2022 | Chopra | ............. | H05K 7/20636 |
| 2022/0046828 A1 * | 2/2022 | Miyamura | ......... | H05K 7/20763 |
| 2022/0071049 A1 * | 3/2022 | Heydari | ............. | H05K 7/20781 |
| 2022/0196507 A1 * | 6/2022 | Su | .......................... | G01M 3/20 |

* cited by examiner

*Primary Examiner* — Courtney L Smith
(74) *Attorney, Agent, or Firm* — Womble Bond Dickinson (US) LLP

(57) ABSTRACT

According to one embodiment, a leak segregation system for a rack that includes a rack liquid manifold. The system includes at least one leak segregation structure that is mounted to the manifold, the structure having a top opening, a bottom that includes at least one opening, a back opening for receiving a manifold connector of the manifold, and a front opening for receiving a connector of an electronics component mounted within the rack, where the structure contains the manifold connector and at least partially contains the connector when the connectors are coupled together. The system also includes a leak detection structure that is positioned below the leak segregation structure and includes a leak detection sensor that is configured to detect a presence of liquid from the leak segregation structure.

20 Claims, 8 Drawing Sheets

ELECTRONICS RACK WITH LEAK SEGREGATION SYSTEM

FIELD

Embodiments of the present disclosure relate generally to an electronics rack that includes a leak containment and segregation system that contains and detects liquid coolant leaks within an electronics rack.

BACKGROUND

Recently, data centers have been deploying more high-power density electronics racks, where more high-density chips are packaged closer together to provide more processing power. This is especially the case due to developments in artificial intelligence (AI) and cloud-based services, which require high performance and high power density processors, such as control processing units (CPUs) and graphic processing units (GPUs).

Thermal management for a data center that includes several active electronics racks is critical to ensure proper performance of servers and other information technology (IT) equipment (e.g., performing IT data processing services) that is operating in the racks. Without proper thermal management, however, the thermal environment (e.g., temperature) within the racks may exceed thermal operational thresholds, which may result in adverse consequences (e.g., servers failing, etc.). One way to manage the thermal environment is to liquid cool the IT equipment. For instance, equipment may include cold plates on which processors are mounted within the equipment. Cooling liquid is passed through the cold plates in order to transfer heat away from the active processors.

With fluid flowing through liquid cooling equipment, such as tubes, fittings, etc., within the rack, leaks may occur (e.g., due to wear and tear, defective parts, mal-operation, etc.). As a result, fluid may leak out of liquid cooling equipment, thereby reducing the cooling effectiveness of the equipment. In addition, the leaking liquid may come into contact with electronics (e.g., servers) that are mounted in the rack, and may cause damage (e.g., electrical shorts). Thus, there is a need for a leak prevention design that prevents liquid from leaking (e.g., from fittings, tubes, etc.) and spreading throughout an electronics rack, as well as detects the leaking fluid in order manage (e.g., deactivate) electronics that may be affected by the leaking fluid.

BRIEF DESCRIPTION OF THE DRAWINGS

The embodiments are illustrated by way of example and not by way of limitation in the figures of the accompanying drawings in which like references indicate similar elements. It should be noted that references to "an" or "one" embodiment of this disclosure are not necessarily to the same embodiment, and they mean at least one. Also, in the interest of conciseness and reducing the total number of figures, a given figure may be used to illustrate the features of more than one embodiment, and not all elements in the figure may be required for a given embodiment.

DETAILED DESCRIPTION

Figure 1:
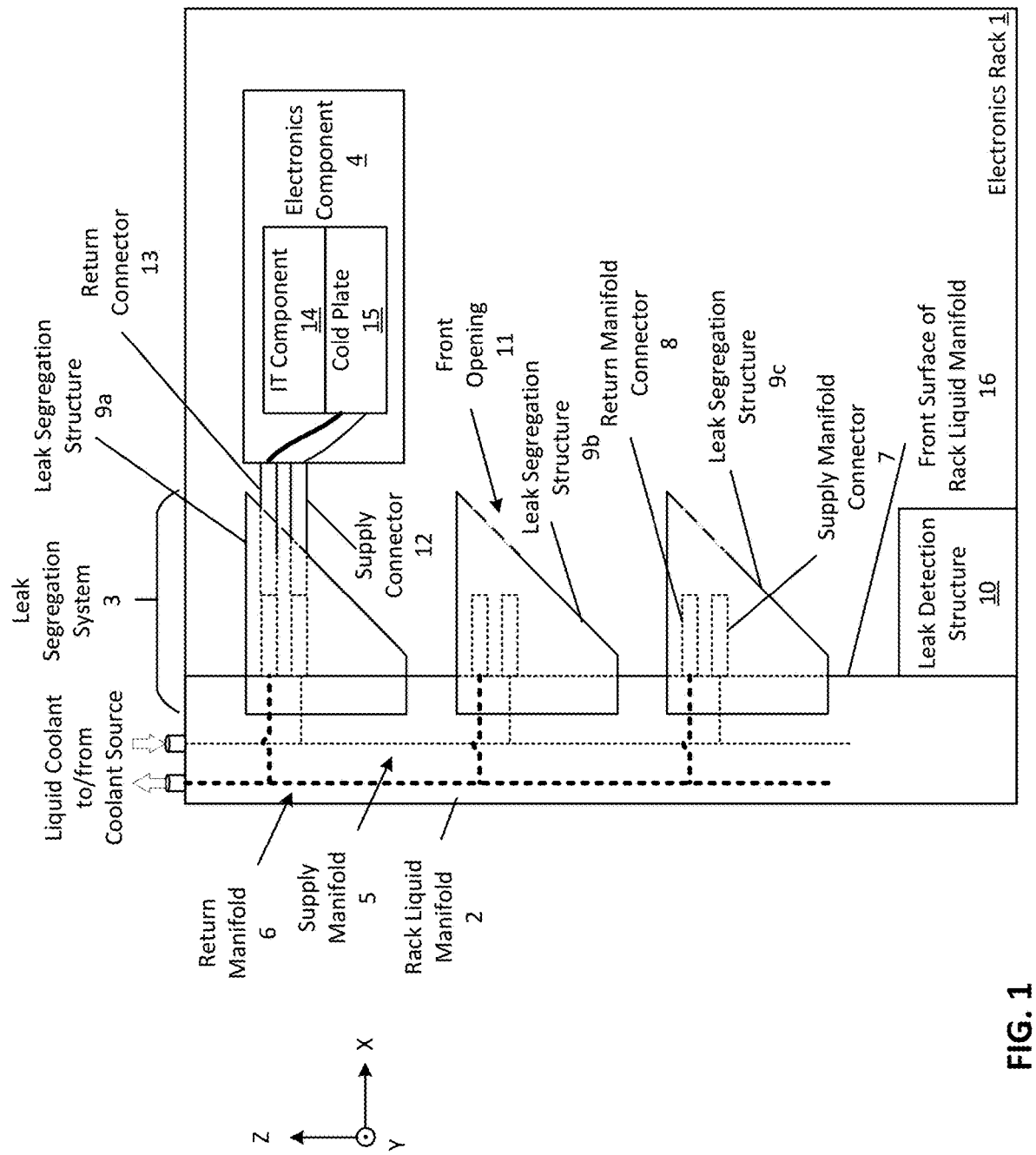
FIG. 1 shows an example of a leak segregation system that includes several leak segregation structures and a leak detection structure for an electronics rack according to one embodiment.

Several embodiments of the disclosure with reference to the appended drawings are now explained. Whenever the shapes, relative positions and other embodiments of the parts described in a given embodiment are not explicitly defined, the scope of the disclosure here is not limited only to the parts shown, which are meant merely for the purpose of illustration. Also, while numerous details are set forth, it is understood that some embodiments may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

The present disclosure solves the problem of segregating leaks (or preventing leaking liquid) that may occur (or originate) from liquid cooling components (e.g., cold plates, connectors, liquid carrying lines, fittings, etc.) in (e.g., one or more electronics components of) an electronics rack from coming into contact with other electronics (e.g., servers) mounted therein, and in addition detecting the leaking liquid in order to mitigate any issues that may occur due to the leaking liquid (e.g., shutting down or powering down electronics that may be affected by the leak). Specifically, the present disclosure describes a leak segregation system (or system) for an electronics rack (e.g., server rack) that provides an integrated and efficient leak prevention (or segregation) solution into the electronics rack. For instance, the leak segregation system includes a leak segregation structure that is designed to removably mount to a rack liquid manifold (e.g., which may be a preexisting rack liquid manifold within an electronics rack) to contain (or surround) one or more manifold connectors of the manifold. As a result, such a structure may be mounted onto a (e.g., preexisting) rack liquid manifold without requiring any changes to the existing hardware. Also, the structure is designed to surround (e.g., at least partially surround a bottom, sides, and/or top of the) manifold connectors, such that liquid that may leak (or spray) from the manifold connectors may (e.g., at least partially be) contained within the leak segregation structure. In addition, the structure has a front opening for receiving a connector of (e.g., a liquid cooling system, which may include one or more cold plates mounted on) an electronics component (e.g., server or electronics board), such that the structure may at least partially contain the connector (e.g., contains a connecting point of the manifold connector and the connector of the electronics component) when the connector is coupled to the manifold connector.

In addition, the leak segregation structure includes a bottom that may include at least one opening, where liquid may (e.g., naturally, through gravity) be guided (or directed) out from the structure through the opening. As a result, the liquid may be guided out from the structure through a predetermined (or a designed) path through the opening. In addition, when the manifold includes several manifold connectors arranged in a stack, leak segregation structures may be mounted for each or (or for the one or more) connectors, such that the leak structures may also be arranged in a stack. If a leak were to occur, the leaking liquid may travel downward through the stack of leak segregation structures (e.g., leaking liquid may enter an open top of a first leak segregation structure that is below a second leak segregation structure, and may travel through the first structure and out the that structure's open bottom). As a result, a (e.g., vertically oriented) chain of leak segregation structures form a path through which leaking liquid is guided downward (e.g., and along a front surface of the rack liquid manifold).

The leak segregation system also includes a leak detection structure that is positioned below the leak segregation structure(s), where the leak detection structure has a leak detection sensor that is configured to detect a presence of liquid that may drip down from one or more leak segregation structure above the leak detection structure. Thus, the system may detect a presence of leaking liquid with high accuracy, while only requiring one (or several) leak detection sensors for (at least a portion of) the entire rack liquid manifold.

According to one embodiment, a leak segregation system for an electronics rack that includes a rack liquid manifold, the leak segregation system comprising: a leak segregation structure that is removably mounted to the rack liquid manifold, the leak segregation structure having a top opening, a bottom that includes an opening, a back opening for receiving a first connector of the rack liquid manifold, and a front opening for receiving a second connector of an electronics component mounted within the electronics rack, the leak segregation structure extends from a front surface of the rack liquid manifold such that the leak segregation structure contains the first liquid connector of the rack liquid manifold and at least partially contains the second connector when the first and second connectors are received through their respective openings and are coupled together; and a leak detection structure that is positioned below the leak segregation structure, the leak detection structure having a leak detection sensor that is configured to detect a presence of liquid from the leak segregation structure.

In one embodiment, the bottom tapers along a vertical axis that runs through the leak segregation structure towards the opening. In another embodiment, the leak segregation structure includes a front side that tapers along a vertical axis that runs through the leak segregation structure and away from the front opening of the leak segregation structure. In some embodiments, the leak segregation structure further comprises a first extending arm and a second extending arm that extend in a direction that is opposite from the front opening, wherein the first and second extending arms are arranged to couple to the rack liquid manifold to mount the leak segregation structure to the rack liquid manifold. In one embodiment, the leak detection structure comprises a converging channel that includes a top portion that tapers inward and towards a center vertical channel that is arranged to house a leak detection cable that is communicatively coupled to the leak detection sensor.

In one embodiment, the leak segregation structure is one of a first plurality of leak segregation structures that are removably mounted to the rack liquid manifold and are arranged in a stack above the leak detection structure, wherein the rack liquid manifold comprises a supply rack liquid manifold that receives liquid from a coolant source and to which the first plurality of leak segregation structures are removably mounted, and a return rack liquid manifold that returns liquid to the coolant source and to which a second plurality of leak segregation structures are removably mounted in a stack, wherein leak segregation structures from the first and second pluralities of leak segregation structures are paired, each pair having a first leak segregation structure from the first plurality of leak segregation structures and a second leak segregation structure from the second plurality of leak segregation structures, and, for each pair, the first leak segregation structure is arranged to contain a supply manifold connector that is coupled to the supply rack liquid manifold and the second leak segregation structure is arranged to contain a return manifold connector that is coupled to the return rack liquid manifold.

In another embodiment, the leak detection structure is a first leak detection structure that is positioned below the first plurality of leak segregation structures and the leak detection sensor is a first leak detection sensor that is configured to detect the presence of liquid from any of the first plurality of leak segregation structures, wherein the leak segregation system further comprises a second leak detection structure that is positioned below the second plurality of leak segregation structures, and has a second leak detection sensor that is configured to detect a presence of liquid from any of the second plurality of leak segregation structures. In some embodiments, the leak detection structure is positioned below the plurality of pairs of leak segregation structures, wherein the leak detection sensor is configured to detect a presence of liquid from any of the leak segregation structures of the first and second plurality of leak segregation structures.

In one embodiment, the first connector is a supply manifold connector of the rack liquid manifold and the second connector is a supply connector of the electronics component, wherein the back opening is for receiving the supply manifold connector and a return manifold connector of the rack liquid manifold such that the leak segregation structure contains both connectors, wherein the front opening is for receiving the supply connector and a return connector of the electronics component such that the leak segregation structure at least partially contains both the supply and return connectors when received through the front opening and coupled to the supply and return manifold connectors, respectively. In another embodiment, the leak detection structure is coupled to and is positioned at a bottom of the rack liquid manifold.

According to another embodiment, an electronics rack includes an electronics component mounted within the electronic rack for providing data processing services and a rack liquid manifold. The electronics rack includes a similar leak segregation system as previously described.

Accordingly to another embodiment, a leak segregation system for an electronics rack that includes a rack liquid manifold, the leak segregation system comprising: a chassis that is coupled to the rack liquid manifold, the chassis comprising a plurality of openings, each opening for receiving a first connector of the rack liquid manifold; a plurality of leak segregation structures that are mounted to the chassis and are arranged in a stack, each leak segregation structure at least partially surrounding a respective first connector of the rack liquid manifold that has been received by a respective opening of the plurality of openings, each leak segregation structure having: a top opening, a bottom that includes at least one opening, and a front opening for receiving at least a portion of a second connector of an electronics component mounted within the electronics rack when the second connector and the respective first connector are coupled together; and a leak detection structure that is mounted to the chassis and is positioned below the stack of leak segregation structures, the leak detection structure having a leak detection sensor that is configured to detect a presence of liquid from any of the plurality of leak segregation structures.

In one embodiment, as used herein, "to couple" one component (or element) to another component may refer to "fluidly" coupling the two components so that a fluid (or liquid), such as a cooling liquid or a liquid coolant may flow between the two components. For example, coupling a first tube to a second tube may couple both tubes together such that liquid coolant may flow from the first tube into the second tube (and/or vice a versa).

FIG. 1 shows an example of a leak (containment and) segregation system that includes several leak segregation structures and a leak detection structure for an electronics rack according to one embodiment. Specifically, this figure is showing a side view of an electronics rack 1 that includes (e.g., contained within a housing of the electronics rack) a rack liquid manifold 2, an electronics component 4, and a leak segregation system 3 that is arranged to contain and segregate (or prevent) liquid that may leak from (e.g., a portion of the) rack liquid manifold from spilling (or entering) a remainder of the electronics rack. In one embodiment, the electronics rack may include more or less components, such as having more (e.g., two or more) electronics components.

In one embodiment, the electronics component 4 may be mounted within the electronics rack. In one embodiment, the electronic rack may include one or more (server) slots that are each designed to contain (or house) one or more electronics components. In addition, as shown, the electronics component includes an information technology (IT) component 14 (e.g., one or more processors such as central processing units or CPUs and/or graphical processing units (GPUs), memory, and/or storage devices). In one embodiment, the electronics component may include one or more IT components (e.g., mounted therein). In some embodiments, IT components may perform data processing tasks, where an IT component may include software installed in a storage device, loaded into the memory, and executed by one or more processors to perform the data processing tasks. In one embodiment, the electronics component may be any type of electronics equipment that may include one or more IT components (and may have one or more liquid cooling components for cooling the electronics component). For example, the electronics component may include an electronics board (e.g., a server printed circuit board (PCB)), to which one or more IT components are mounted. In another embodiment, the electronics component may include a cloud server that is configured to perform cloud-based data processing. In another aspect, the electronics component may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs or different types of accelerators) managed by the host server. In another embodiment, when the electronics rack includes two or more electronics components, each component may perform similar (or different) operations than other components contained therein. In one embodiment, when the IT component (e.g., processor) performs computational tasks, the component may generate heat. In some embodiments, the electronics component may be air-cooled to transfer the generated heat away from the IT components and into the ambient air. In another embodiment, the (e.g., IT component of the) electronics component may include liquid cooling components (e.g., a cold plate 15, as shown herein) to provide liquid cooling. More about liquid cooling is described herein.

In one embodiment, the rack liquid manifold 2 provides liquid cooling to the electronics component 4 (and any additional components) that is mounted to the manifold. Specifically, the rack liquid manifold may be (e.g., fluidly) coupled (e.g., via one or more connectors) to a coolant source (e.g., a data center's cooling liquid system, one or more heat exchangers (e.g., heat exchanger 513 shown in FIG. 6), etc.) to circulate liquid coolant through one or more (e.g., liquid cooling components of the or mounted on) electronics components that are coupled to the rack liquid manifold. As shown, the rack liquid manifold includes a supply manifold 5 (e.g., that may include tubes, lines, connectors, etc.) that is arranged to supply liquid coolant (received from the coolant source) to one or more electronics components, and includes a return manifold 6 that is arranged to receive (e.g., warmed) liquid coolant from the components, thus forming at least one heat transfer loop for each of the electronics components that are coupled to the rack liquid manifold.

In one embodiment, the rack liquid manifold includes one or more pairs of manifold (e.g., liquid) connectors that are arranged to couple to electronics components. In particular, the rack manifold includes three pairs of connectors that are arranged in a vertically orientated stack (e.g., along the Z-axis) that extend out (e.g., along the X-axis) from a front surface of the rack liquid manifold 16. In some embodiments, the rack liquid manifold may include more (or less) pairs of connectors. In another embodiment, one or more pairs of manifold connectors may be arranged differently (e.g., extending from different surfaces of the rack liquid manifold, etc.). In one embodiment, each pair of manifold connectors has a supply manifold connector 7 that is coupled to the supply manifold 5 and a return manifold connector 8 that is coupled to the return manifold. Each pair of manifold connectors are arranged to couple to connectors of electronics components to create a liquid coolant supply (or supply path) through which liquid coolant flows form the supply manifold 5 into electronics components, and a liquid coolant return path (or return path) through which liquid coolant is returned from electronics components into the return manifold. As shown, the electronics component is coupled to the top pair of supply and return manifold connectors to create the heat exchange loop. Specifically, the component includes a supply connector 12 that is coupled to the supply manifold connector 7 to create the supply path and a return connector 13 that is coupled to the return manifold connector 8 to create the return path.

To create the heat transfer loop, the electronics component includes at least one IT component 14 with one or more cold plates 15 that are each arranged to mount on (or to be mounted by) one or more IT components. As described herein, the electronics component is coupled to the rack liquid manifold in order to circulate liquid coolant through the component. Specifically, the cold plate within the electronics component is coupled to connectors 12 and 13 (e.g., via one or more liquid lines) in order to circulate liquid coolant through the cold plates, thereby creating the heat-transfer loop, as described herein. For example, when the supply and return connectors 12 and 13 are coupled to the supply and return manifold connectors 7 and 8, respectively, liquid coolant supplied by the supply manifold 5 flows (e.g., through the coupled supply and supply manifold connectors and) into cold plate 15 that is designed to transfer heat generated by the IT component 14 mounted therein into the liquid coolant that flows through the cold plate, thereby warming the coolant. The warmed coolant flows out of the electronics component (e.g., through the coupled return and return manifold connectors) and into the return manifold 6. As illustrated herein, the electronics component has one IT component mounted on one cold plate. In one aspect, the electronics component may include one or more cold plates (e.g., fluidly coupled in series and/or parallel), where each cold plate liquid cools one or more IT components, as described herein.

In one embodiment, at least some of the connectors described herein may be designed to removably coupled to other connectors. For example, as shown, the supply and return connectors 12 and 13 of the electronics component may be removably to the supply and return manifold connectors 7 and 8, respectively, such that the component may be removably coupled to the rack liquid manifold. As a result, the electronics component may be disconnected (e.g., by a technician) from the rack liquid manifold, thereby allowing the component to be removed from the electronics rack. In some embodiments, the connectors may be any type of connectors, such as dripless blind mating quick disconnects.

As described herein, the leak segregation system 3 is arranged (or designed) to segregate leaking liquid from leaking (or spilling) out and making contact with a remainder of (e.g., other electronics mounted on) the electronics rack. As shown, the system includes three leak segregation structures 9a-9c (where any of which may be referred to as "leak segregation structure 9", as described herein), each removably coupled to (or mounted on) the (e.g., rack liquid manifold 2 of the) electronics rack 1, and a leak detection structure 10 that is coupled to and is positioned at a bottom of (e.g., below the leak segregation structures of) the rack liquid manifold 2. Specifically, the leak detection structure 10 (and the leak segregation structures) may be arranged to couple to the rack liquid manifold such that the (leak segregation and/or leak detection) structures each abut (or come into contact with) at least a front the front surface of the rack liquid manifold 16. In one embodiment, the leak segregation structures and the leak detection structure may be arranged in a vertically orientated stack, where the leak detection structure is positioned at a bottom and (e.g., directly) under the stack of leak segregation structures. As described herein, this may allow leaking liquid to travel (e.g., along the front surface of the manifold) downward from one or more leak segregation structures and into (or on) the leak detection structure.

In one embodiment, each leak segregation structure is arranged to extend (e.g., at least along the X-axis) from the front surface of the rack liquid manifold 16 such that each leak segregation structure (e.g., at least partially) contains one or more manifold connectors of the rack liquid manifold 2, when coupled to the rack liquid manifold. In particular, leak segregation structure 9a (e.g., entirely) contains a top (or first) pair (e.g., along the stack of) manifold connectors, leak segregation structure 9b contains the middle (or second) pair of manifold connectors, and leak segregation structure 9c contains the bottom (or third) pair of manifold connectors. As described herein, the leak segregation structures "contain" one or more manifold connectors, such that the manifold connectors are contained within (e.g., an open or hollow) space that is formed within (e.g., or surrounded by one or more sides or walls of) the leak segregation structure. By surrounding the manifold connectors with one or more sides or walls of the leak segregation structure, liquid that leaks from (or sprays out of) the connectors may be prevented by the sides or walls from leaking out of the structure. More about the physical characteristics of the leak segregation structures are described in FIG. 2.

In one embodiment, one or more leak segregation structures include a front opening 11 for receiving one or more connectors of the electronics component 4 that is mounted within the electronics rack. Specifically, the front opening 11 is for receiving the supply and return connectors 12 and 13 of the electronics component such that both connectors are inserted into the leak segregation structure 9a in order to couple the connectors to the supply and return manifold connectors 7 and 8, respectively. As a result, when the electronics component is coupled to manifold connectors of the rack liquid manifold that have (or are contained within) a leak segregation structure (e.g., the connectors of the component are received through the front opening), the segregation structure contains the manifold connectors and at least partially contains the (one or more) connectors of the electronics component. Specifically, the leak segregation structure 9a of this figure contains (approximately) half of the supply and return connectors 12 and 13. In one embodiment, the leak segregation structure may entirely contain the supply and return connectors and the manifold connectors when both are coupled together (e.g., the leak segregation structure may abut a (e.g., front) side of the electronics component). In another embodiment, the leak segregation structure at least contains a connection point at which each pair of respective connectors couple to one another (e.g., where a front end of the supply manifold connector 7 couples comes into contact with a front end of the supply connector 12). This ensures that any leaks that may occur at this connection point are isolated within the leak segregation structure.

Figure 2:
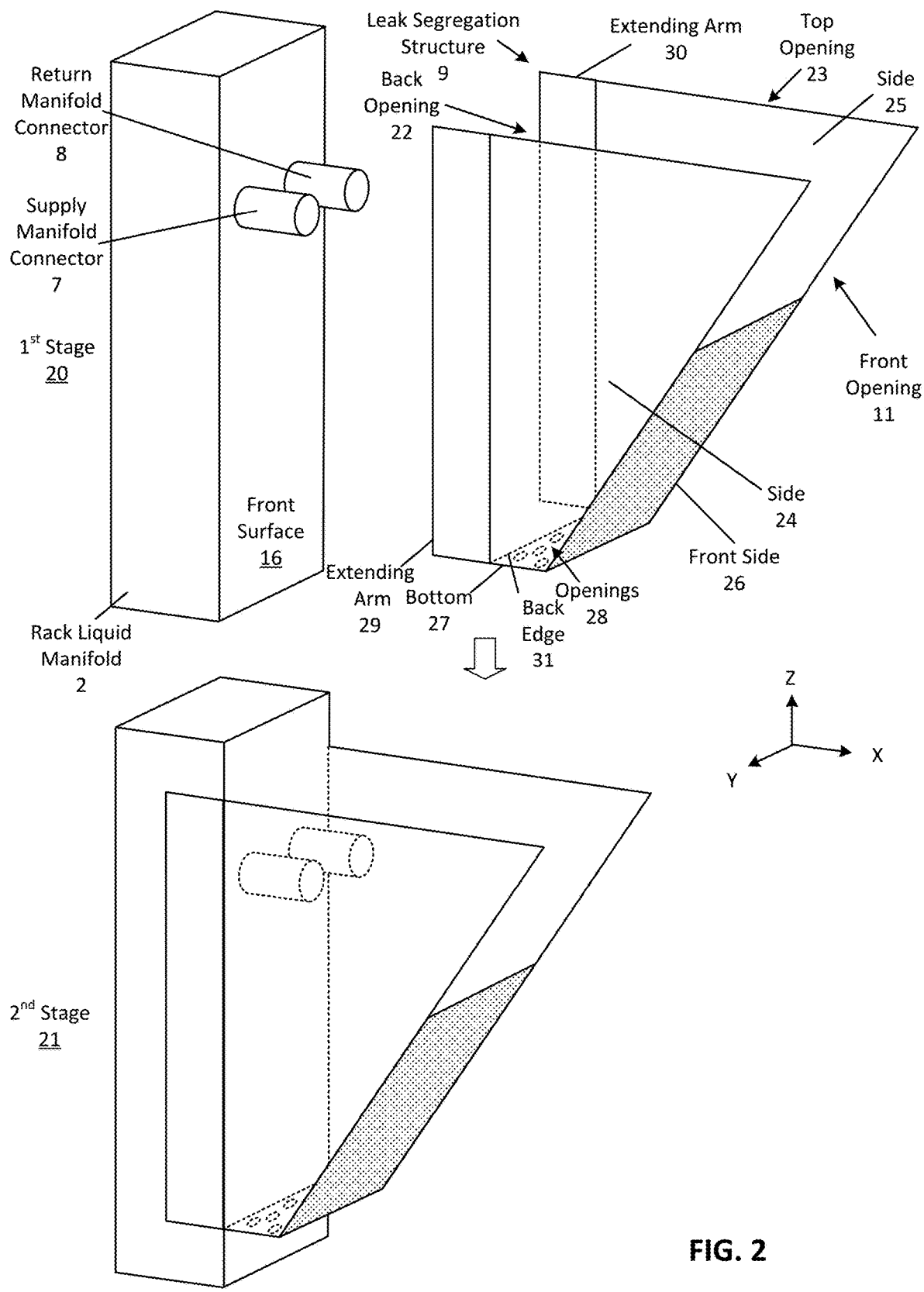
FIG. 2 shows several stage of a side perspective view of a leak segregation structure of the leak segregation system in which the leak segregation structure is being coupled to a rack liquid manifold according to one embodiment.

In one embodiment, the leak segregation structures may be arranged to guide liquid downward towards the leak detection structure 10. Specifically, the leak segregation structures may have physical characteristics (or features) that guide liquid downward (and/or along the front surface of the rack liquid manifold 16) and into the leak detection structure 10. For example, each (or at least some) of the leak segregation structures may include a top opening and a bottom with one or more openings (e.g., top opening 23 and bottom 27 with one or more openings 28, as shown in FIG. 2). These features allow liquid, which may be leaking from connectors of a leak segregation structure, to flow out of the structure and into a lower structure in the stack of (e.g., vertically orientated) structures, and subsequently into the leak detection structure 10. For example, if a leak were to occur at the supply manifold connector 7 contained within the top leak segregation structure 9a of the three stacked structures shown in this figure, the liquid would flow downward, through both leak segregation structures 9b and 9c, and into (or on) the leak detection structure 10. More about the physical features of the leak segregation structures that enable liquid to flow downward and into the leak detection structure is described in FIGS. 2 and 3.

In one embodiment, the leak detection structure 10 is positioned below the leak segregation structures 9a-9c, and may be arranged to detect a leak by detecting a presence of liquid (e.g., that flows from the leak segregation structures). Specifically, the leak detection structure may include a leak detection sensor that is configured to detect a presence of liquid from the above leak segregation structures. More about the physical characteristics of the leak detection structure and how the presence of liquid is detected is described herein.

In another embodiment, the leak segregation system may include one or more additional components. For example, the leak segregation system may include one or more leak detection structures 10. In which case, each structure may be mounted to the rack liquid manifold, and may be configured to detect a presence of liquid from any leak segregation structures that are above the detection structure. For example, if a leak detection structure were placed between the leak segregation structures 9a and 9b, the added leak detection structure would be configured to detect a presence of liquid from leak segregation structure 9a, while if another were placed at the bottom of the rack liquid manifold (e.g., as shown in this figure), this other one would be configured to detect a presence of liquid from either (or both) leak segregation structures 9b and 9c.

As described thus far, the leak segregation system 3 is arranged to segregate or (contain) leaking liquid within the system and to detect the presence of liquid. By segregating the liquid within the system, the electronics rack may continue to operate (e.g., by providing liquid cooling). For instance, the system may continue to circulate liquid coolant through the rack liquid manifold and through the electronics components, while any leaking liquid may be contained within the system (e.g., stored within the leak detection structure). In one embodiment, the leak detection structure may include a reservoir (e.g., that is coupled to the channel 35, shown in FIG. 3). Thus, once a leak occurs, liquid may travel downward through the leak segregation structures, in the leak detection structure, and be stored within the reservoir. In another embodiment, the leak detection structure may have an outlet (e.g., at a bottom of the structure) through which liquid may be guided out of (e.g., and into a drain in a data center room in which the electronics rack is contained).

As shown thus far, each pair of manifold connectors is contained by a leak segregation structure. In some embodiments, less leak segregation structures may be coupled to the rack liquid manifold, than a number of pairs of manifold connectors. In other words, any order or number of leak segregation structures may be mounted to the rack liquid manifold, which may result in at least some pairs of connectors may not have an associated leak segregation structure. For example, the leak segregation structure 9b and 9c may be removed from the rack liquid manifold, leaving only leak segregation structure 9a, since manifold connectors associated with those structures are not coupled to an electronics component 4. Thus, the leak segregation system allows leak segregation structures to be added and/or removed based on need.

FIG. 2 shows several stages 20 and 21 of a side perspective view of a leak segregation structure of the leak segregation system in which the leak segregation structure is being coupled to (e.g., a portion of) the rack liquid manifold 2 according to one embodiment. Specifically, this figure shows one or more physical characteristics of the leak segregation structure 9, which enable the structure to segregate leaking liquid, as well as guide liquid contained therein downward. In one embodiment, the leak segregation structures as described herein (e.g., structures 9a-9c shown in FIG. 1) may include at least some of the physical characteristics of structure 9, as shown in this figure.

As shown, the leak segregation structure 9 includes a front side 26 that is coupled between a (e.g., left or first) side 24 and a (e.g., right or second) side 25 of the leak segregation structure. The structure also includes a bottom 27 that is coupled to (at least one of the) sides 24 and 25, and/or to the front side 26 of the leak segregation structure. In addition, the structure includes several extending arms, each extending arm coupled to a respective side of the leak segregation structure. For instance, the structure includes a (e.g., left-sided or first) extending arm 29 that is coupled to the left side 24, and includes a (e.g., right-sided or second) extending arm 30 that is coupled to the right side 25. In one embodiment, both extending arms extend (e.g., from their respective sides 24 and 25) in a direction (e.g., along the X-axis) that is opposite from the front opening 11, where both extending arms are arranged to couple to the rack liquid manifold 2 to mount the leak structure to the rack manifold. More about mounting the leak segregation structure is described herein.

In one embodiment, the features of the leak segregation structure may be fixedly coupled together, such that they form one integrated unit. In particular, the features may be formed by one or more materials (e.g., an alloy, such as aluminum) into one frame or housing. In another embodiment, at least some of the features may be removably coupled to one another. For example, the extending arms may be removably coupled to their respective sides.

In one embodiment, the leak segregation structure includes one or more openings, which are formed by the physical features (e.g., sides) of the structure. For example, the structure includes a front opening 11 that is formed between (or adjacent to) the front side 26 and sides 24 and 25, and is also arranged to receive one or more connectors of one or more electronics components, as described herein. As shown, the front opening has a rectangular shape that extends between the sides 24 and 25 of the structure. In another embodiment, the front opening may include one or more openings that are shaped to receive one or more connectors. Specifically, the one or more front opening may have a cross-sectional shape that is as large (or slightly larger) then a cross-sectional shape of the connectors of the electronics components. For example, when the connectors are cylindrically shaped having a first diameter, the front openings may be circular shaped with a second diameter, that is larger than the first diameter. In this way, the front openings may be shaped to receive the connectors while having a minimal amount of space between the connectors and an edge of the opening, thereby minimizing space through which leaking liquid may escape from the structure. In another embodiment, the front opening may have any shape.

The structure 9 also includes a top opening 23 that extends along (e.g., at least a portion of a length in the X-direction) of sides 24 and 25. In one embodiment, the top opening may extend at least a portion of a length (e.g., along the X-axis) of both the extending arms and the sides of the structure, as shown. In another embodiment, the top opening may at least extend from the extending arms (e.g., where the sides 24 and 25 are adjacent to or couple to the extending arms 29 and 30, respectively), for at least a predefined length along top edges of the sides 24 and 25 of the structure. As shown, the top opening 23 and the front opening are adjacent to one another such that both openings create a combined opening that extends from a frontend of the structure to a backend of the structure.

The structure 9 includes a back opening 22 that extends (e.g., along the Z-axis) from the top opening 23 of the structure to the bottom 27 of the structure. In addition, the back opening may extend along a width (along the Y-axis) of the leak structure, between both sides 24 and 25 of the structure. In another embodiment, the leak segregation structure may include one or more other openings. In one embodiment, the back opening is for receiving one or more manifold connectors of the rack liquid manifold (e.g., while the leak segregation structure is mounted to the rack liquid manifold). In some embodiments, the back opening may be arranged (or sized) to receive the manifold connectors. For example, the back opening may have one or more openings that are sized to receive the manifold connectors (e.g., by having a cross-sectional shape that is similar to but larger than (e.g., by a threshold) a cross-sectional shape of the manifold connectors). More about the back opening receiving the manifold connectors is described herein.

In one embodiment, the leak segregation structure is formed to naturally (e.g., using gravity to) promote the movement (or formed to efficiently guide) liquid from a top (e.g., the top opening 23) of the leak segregation structure to the bottom 27 of the structure. For example, the front side 26 tapers along a vertical axis that runs through the leak segregation structure (e.g., the Z-axis) and away from the front opening 11 of the leak segregation structure. Thus, liquid that comes into contact with (e.g., the interior of) the front side is guided downward towards the bottom 27 of the structure. In another embodiment, the structure may be shaped differently. For instance, as shown, the sides 24 and 25 run vertically along the Z-axis. In another embodiment, the sides may taper in a similar fashion as the front side in order to promote liquid movement downward.

The bottom 27 includes one or more openings 28 that fluidly couple the interior of the leak segregation structure to the ambient environment, and are arranged to allow liquid to flow out of the leak segregation structure. As shown, the bottom includes several openings (or perforations) that may be scattered along the bottom in order to allow liquid to drip downward from the leak segregation structure. In another embodiment, the bottom may include one or more openings that are along a back edge 31 (e.g., an edge that comes into contact with or abuts the front surface 16 of the rack liquid manifold when the structure is coupled to the manifold). This may allow (and guide) liquid downward to run along the front surface 16. More about how the liquid runs down the rack liquid manifold is described herein. In one embodiment, the bottom 27 may be a flat surface, as shown. In another embodiment, the bottom may be shaped in order to promote downward movement of liquid, such as being tapered along a vertical axis that runs through the leak segregation structure. More about the bottom being tapered is described in FIG. 4.

In one embodiment, the leak segregation structure has a triangular shape, such that a top edge (e.g., running along sides 24 and 25) has a first length, while the bottom 27 has a second length that is less than the first length. This shape enables to converge leaking fluid within the leak segregation structure. In another embodiment, the leak segregation structure may be shaped and/or sized differently.

As described herein, this figure shows two stages 20 and 21, in which the leak segregation structure 9 is being coupled (e.g., removably mounted) to (e.g., at least a portion of) the rack liquid manifold. The first stage 20 shows the leak segregation structure 9 in front of the (front surface 16 of the) rack liquid manifold 2, which has a pair of supply and return manifold connectors 7 and 8.

The second stage 21 shows that the leaks segregation structure 9 has been mounted to the rack liquid manifold, such that both manifold connectors are received by (e.g., inserted through) the back opening 22 and are contained within (e.g., open space within) the leak segregation structure. Specifically, the (e.g., backend of the) leak segregation structure has been moved towards the (e.g., front surface 16 of the) rack liquid manifold, such that both extending arms are positioned over (or above) respective sides of the rack liquid manifold. Specifically, the right-sided extending arm 29 has been positioned over a right side of the rack liquid manifold, while the left-sided extending arm 30 has been positioned over a left side of the rack liquid manifold, such that the rack liquid manifold is between both extending arms. In addition, the leak segregation structure has been moved towards the rack liquid manifold such that the back edge 31 of the bottom 27 is in contact with (or adjacent to) the front surface 16 of the rack liquid manifold. As a result, the front surface of the rack liquid manifold runs down, through the top opening 23 of the leak structure, through the inside of the structure and to the bottom 27.

As described herein, the extending arms may be coupled to (e.g., their respective sides of) the rack liquid manifold in order to mount the leak segregation structure. For example, the extending arms may include one or more fasteners (not shown) that removably couple the extending arms to the rack liquid manifold. In one embodiment, the leak segregation structure may be mounted to the rack liquid manifold while the fasteners are engaged, and may be decoupled from the rack liquid manifold when the fasteners are disengaged. In another embodiment, the leak segregation structure may use any mechanical mechanism to couple to the rack liquid manifold.

In another embodiment, the extending arms couple to another part of the electronics rack in order to mount the leak segregation structure. For example, the extending arms may have a length that is greater than a length of the rack liquid manifold. In which case, the extending arms may extend past the rack liquid manifold and couple to a part (e.g., the frame or housing) of the electronics rack that is behind the rack liquid manifold (not shown).

As described herein, the leak segregation structure 9 may be arranged to contain a pair supply and return manifold connector, while mounted to the rack liquid manifold 2, as shown in FIGS. 1 and 2. In another embodiment, the leak segregation structure may contain multiple pairs of supply and return manifold connectors. Specifically, the leak segregation structure 9 may have a height (along the Z-axis) that extends along a portion of a height of the rack liquid manifold, such that the leak segregation structure may contain multiple stacked pairs of manifold connectors. For example, referring to FIG. 1, the leak segregation structure 9 may contain the top and middle pairs of the manifold connectors of the rack liquid manifold.

Figure 3:
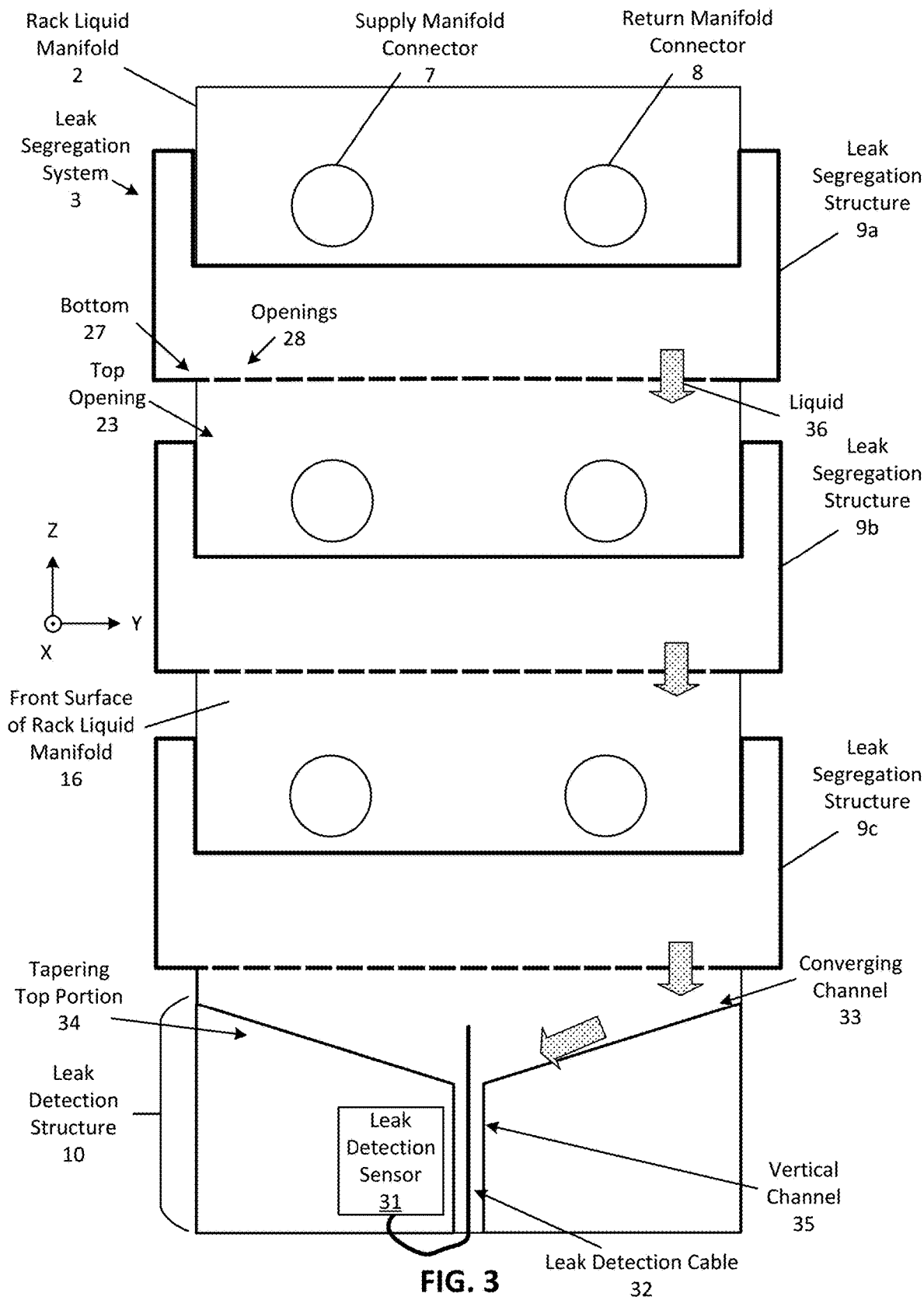
FIG. 3 shows a front view of the leak segregation system with leak segregation structures that contain several manifold connectors in which liquid from a top leak segregation structure flows downward and into a leak detection structure according to one embodiment.

FIG. 3 shows a front view of the leak segregation system with leak segregation structures that contain several manifold connectors in which liquid from a top leak segregation structure flows downward and into the leak detection structure according to one embodiment. This figure shows three leak segregation structures 9a-9c that are mounted to the rack liquid manifold and are arranged in a (e.g., vertically orientated) stack (e.g., along the Z-axis) that is above the leak detection structure 10. As shown, the rack liquid manifold has three pairs of supply and return manifold connectors 7 and 8, where each leak segregation structure contains a respective pair of manifold connectors.

As described herein, the leak detection structure 10 may be positioned below the leak segregation structures (and the manifold connectors of the rack liquid manifold), while the leak segregation structures are coupled to the manifold. In one embodiment, the detection structure may be adjacent to (or abut) the front surface of the rack liquid manifold 16, in order to allow liquid that is flowing downward along the front surface into the leak detection structure.

The leak detection structure includes a leak detection sensor 31, a leak detection cable 31, and a converging channel 33. The converting channel 33 includes a tapering top portion 34 that tapers inward from along a vertical (e.g., Z-) axis towards a (e.g., center) vertical channel 35 that is arranged to house the leak detection cable that is communicatively coupled to the leak detection sensor. As shown, the tapering top portion 34 tapers from either side (e.g., left and right sides) of the rack liquid manifold, downward and towards the vertical channel, which may be positioned at a center location of the leak detection structure 10. Thus, the top portion is sized (and shaped) to guide liquid that is received (e.g., from the leak segregation structures and/or from along the front surface of the rack liquid manifold 16) downward and into the vertical channel. In another embodiment, the top portion may be shaped differently. For example, the top portion may be a shape of funnel, such as having a conical shape with a top opening with a first diameter and a bottom opening, which opens into the vertical channel, with a second diameter that is less than the first diameter.

In one embodiment, the leak detection cable 32 is communicatively coupled to a leak detection sensor 31 (e.g., which may be a part of the leak detection structure) that is configured to produce a control signal that indicates a presence of liquid, when liquid comes into contact with the leak detection cable. For instance, the detection cable may include at least two wires, and when (e.g., a conductive) liquid comes into contact with the cable, the liquid creates a short between the two wires. Once this occurs, the leak detection sensor detects the short and produces the control signal. In some embodiments, the leak segregation system may use any type of leak detection sensor (and/or cable) to detect a presence of liquid (e.g., within the channel). In one embodiment the leak detection sensor may transmit the control signal to one or more controllers (e.g., of the electronics rack), which in response may perform one or more leak detection (or mitigation) operations. More about these operations is described herein.

In one embodiment, the channel 35 and the leak detection cable 32 are vertically orientated (with respect to the rack liquid manifold) in order to promote leak detection. For example, when liquid enters the channel, it travels downward along the leak detection cable. As a result, the traveling liquid may cover a significant amount of surface area of the leak detection cable, which may increase (e.g., above a threshold) a likelihood that liquid is detected when it comes into contact with the cable. In one embodiment, in addition, the channel may be sized (e.g., having a diameter) in order to ensure that liquid within the channel comes into contact with the cable. For example, the channel may be sized to fit the cable, while minimizing an amount of open space between the cable and one or more walls of the channel. For instance, the channel may have a larger (e.g., by a threshold) diameter than the leak detection cable. In addition, although shown to be rectangular, the channel may be any shape (e.g., the channel may be shaped similarly to the leak detection cable, both of which having a cylindrical shape).

This figure also shows the flow of liquid downward along the (e.g., front surface 16 of the) rack liquid manifold and into the (e.g., vertical channel 35 of the) leak detection structure. In this example, liquid has begun to leak from the return manifold connector 8 of the top leak segregation structure 9a. As a result, liquid 36 drips downward to the bottom 27 of the structure 9a and out of the openings 28. The liquid then continues to flow downward through the top opening 23 of the leak segregation structure 96 and out this structures bottom openings 28, and into and out of the bottom leak segregation structure 9c. The liquid that flows from the bottom openings of structure 9c flows into the converting channel 33. Specifically, the liquid flows into the tapering top portion 34, which guides the liquid downward and into the vertical channel 35.

In one embodiment, the flowing liquid 36 may (predominantly) flow along the front surface of the rack liquid manifold, as it flows downward towards the leak detection structure. In other words, the liquid may hug the front surface as it runs downward, which is in contrast to allowing the liquid to drip downward (e.g., from a bottom of a surface to another surface), which would result in splashing of liquid. This ensures that the liquid stays within (or is segregated within) the leak segregation system and does not spill out and away from the segregation structures and leak detection structure.

As described herein, the number of leak segregation structures mounted on the rack liquid manifold may be less than the number of pairs of manifold connectors. For example, the system may not include the leak segregation structure 9b (e.g., due to its associated manifold connectors not being coupled to an electronics component). As a result, if liquid were to leak down from the structure 9a, the liquid would flow downward, past the middle pair of manifold connectors and into the structure 9c. Thus, leaking liquid may be contained within the leak segregation system, even if there are less leak segregation structures than pairs of manifold connectors of the rack liquid manifold.

Figure 4:
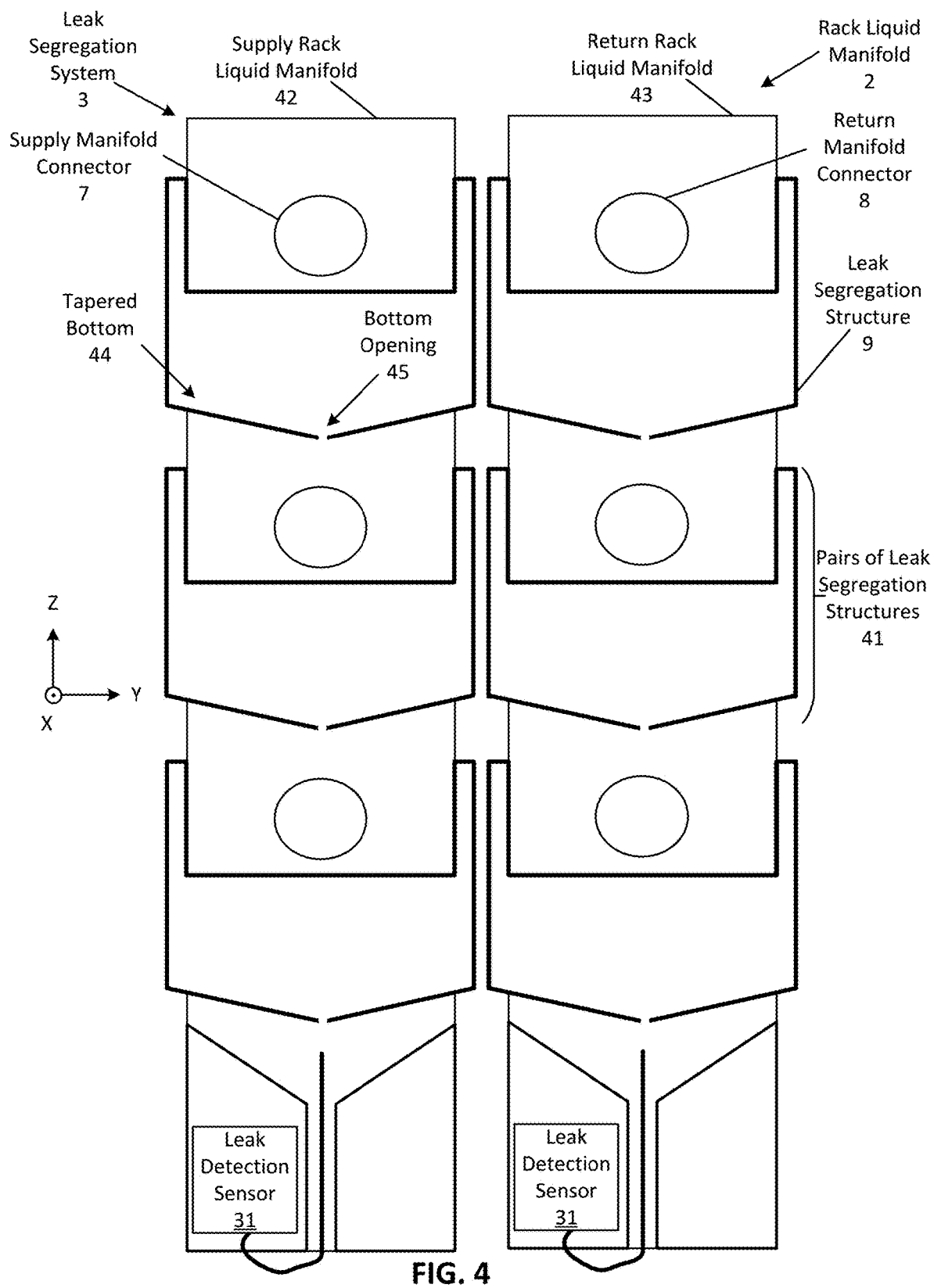
FIG. 4 shows a front view of the leak segregation system with leak segregation structures that each contain a manifold connector according to another embodiment.

FIG. 4 shows a front view of the leak segregation system with leak segregation structures that each contain a manifold connector according to another embodiment. As shown, the rack liquid manifold includes two (e.g., separate manifolds), a supply rack liquid manifold 42 that receives liquid from a coolant source and a return rack liquid manifold 43 that returns (warmed) liquid to the coolant source. In one embodiment, both of these manifolds may be separate structures that may be individually coupled to (e.g., added into a housing of) the electronics rack. In another embodiment, the manifolds 42 and 43 may be coupled together.

Each manifold 42 and 43 include respective manifold connectors that are arranged in a stack. For example, the supply manifold 42 includes three supply manifold connectors 7, while the return manifold 43 includes three return manifold connectors 8. In one embodiment, the manifolds may include more or less manifold connectors. In one embodiment, the manifold connectors are paired together, such that each supply manifold connector is paired and adjacent to a return manifold connector, similar to the configuration as shown in FIG. 3.

As shown, the leak segregation system 3 includes additional components. For example, each manifold 42 and 42 include stacks of three leak segregation structures. For example, the supply rack liquid manifold includes three mounted leak segregation structures that are arranged in a stack, each containing a supply manifold connector 7, while the return rack liquid manifold 43 includes three mounted leak segregation structures that are arranged in a separate stack from the supply rack liquid manifold's stack, each containing a return manifold connector. Each of the stacks is adjacent to one another, thereby creating three pairs of leak segregation structures 41, each pair having a leak structure mounted to the supply rack liquid manifold 42 and another mounted to the return rack liquid manifold.

In addition, the supply and return rack liquid manifolds 42 and 43 each have an individual leak detection structure 10, such that one detection structure is coupled to the supply rack liquid manifold and below its mounted leak segregation structures, and another detection structure is coupled to the return rack liquid manifold and below its mounted leak segregation structures. As a result, the leak segregation system 3 may be configured to detect, using the leak detection sensors 31, whether there is a leak in either the supply or the return manifolds. In another embodiment, the supply and return rack liquid manifolds may share (e.g., a common) leak detection structure 10, similar to as shown in FIG. 3.

As shown, each of the leak segregation structures includes a tapered bottom 44 and a bottom opening 45. Specifically, the tapered bottom tapers along the Z-axis and downward towards the bottom opening. This allows liquid to naturally flow along the bottom of the leak segregation structure and out of the bottom opening. As shown, the bottom of the leak segregation structures tapers from the sides of the leak segregation structure towards the middle (e.g., along the YZ-plane). In another embodiment, the tapering bottom may taper from the front and back of the leak segregation structure towards the middle (e.g., along the XZ-plane). In another embodiment, the bottom may taper differently. For instance, the bottom may taper, such that the opening is close to (or adjacent to) the back opening 22 of the leak segregation structure, such that liquid may be guided flow downward along the front surface of the rack liquid manifold. In another embodiment, the tapered bottom may be funnel (or conically) shaped, as described herein. In another embodiment, the tapered bottom may have any shape that promotes liquid to move downward and through one or more bottom openings.

Figure 5:
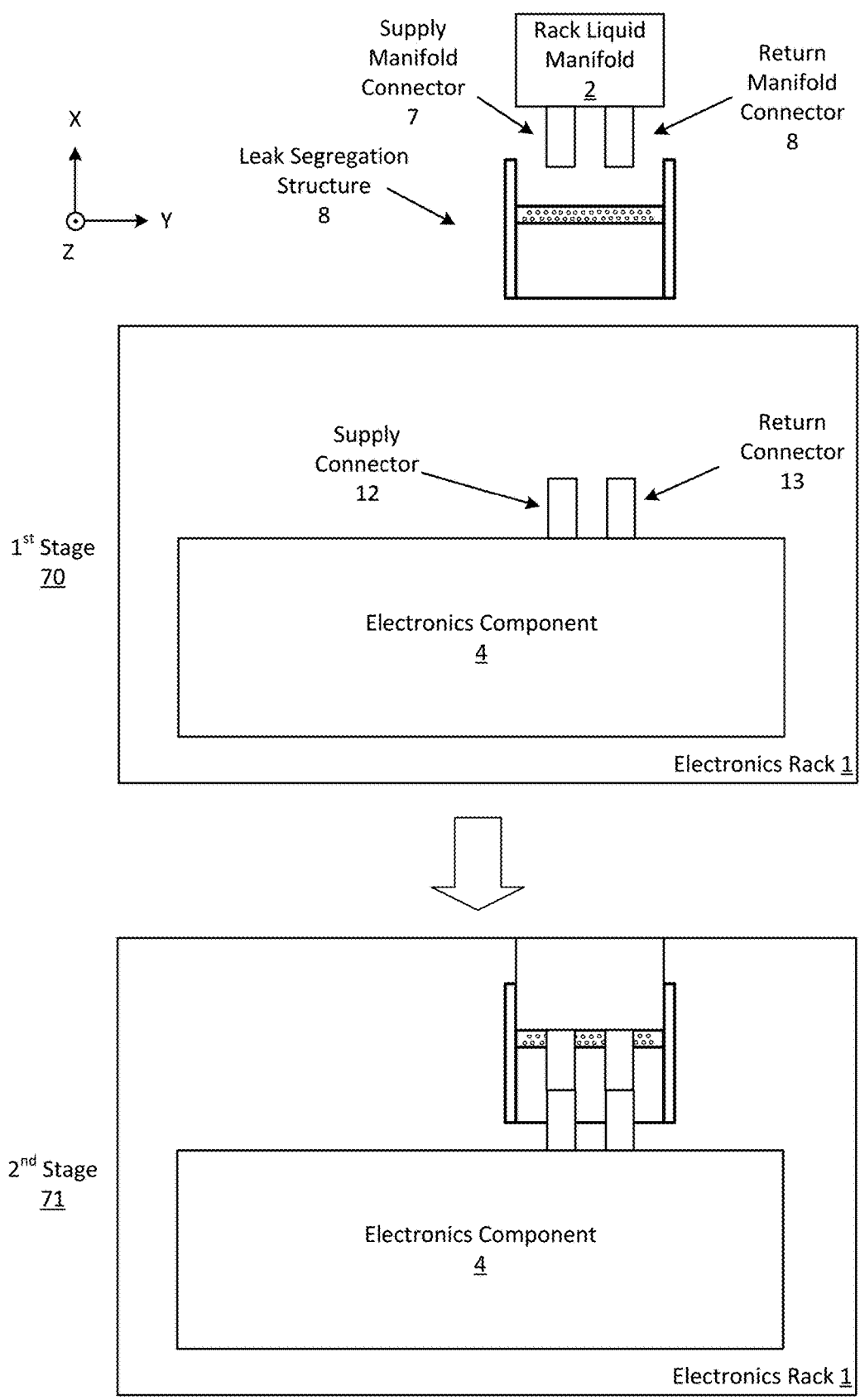
FIG. 5 shows several stages of a top view of the leak segregation system being coupled to a rack liquid manifold that is also being coupled to an electronics component according one embodiment.

FIG. 5 shows several stages 70 and 71 of a top view of the leak segregation system being coupled to a rack liquid manifold that is also being coupled to an electronics component according to one embodiment. For instance, stage 70 shows a top-down view in which the rack liquid manifold 2, leak segregation structure 8, and the electronics component 4 are separate from each other. As shown, the rack liquid manifold is outside the electronics rack 1. In one embodiment, the rack liquid manifold may be removably coupleable to the electronics rack. In another embodiment, the manifold may be fixedly coupled (e.g., fixed within the) electronics rack. Stage 71 shows that each of the components are coupled. Specifically, the leak segregation structure 8 is coupled to the rack liquid manifold, while the supply and return connectors 12 and 13 of the electronics component are coupled to the supply and return manifold connectors 7 and 8, respectively. As a result, the leak segregation structure (e.g., entirely) contains the manifold connectors and (at least partially) contains the connectors of the electronics component.

In one embodiment, the components may be coupled to one another in any order. For example, the leak segregation structure may first be mounted to the rack liquid manifold, and then the electronics component may be coupled to the rack liquid manifold, thereafter. As another example, the electronics component may be coupled to the rack liquid manifold first, and then the leak segregation structure may be subsequently mounted to the rack liquid manifold.

Figure 6:
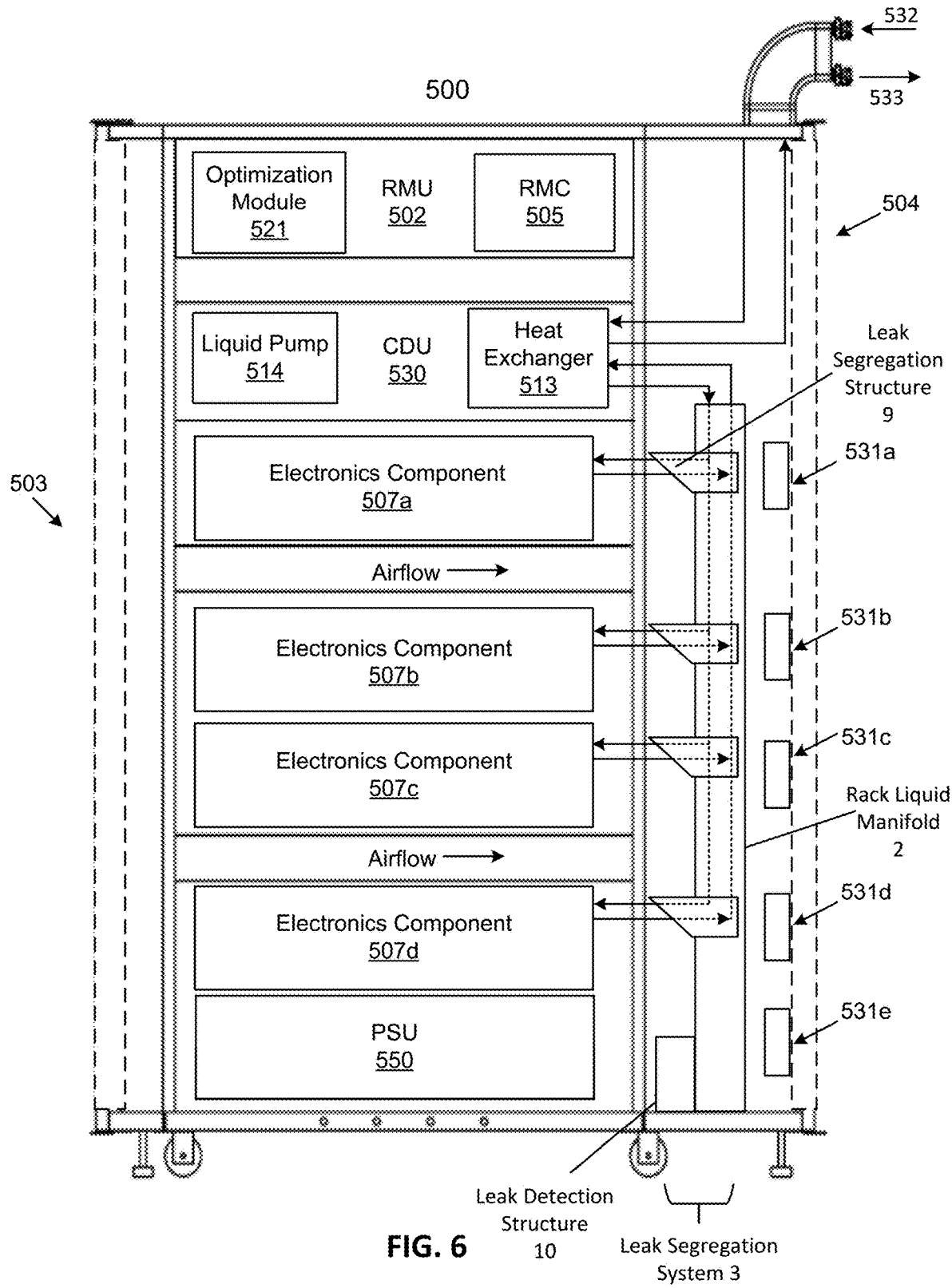
FIG. 6 is an example of an electronics rack that includes a leak segregation system according to one embodiment.

FIG. 6 is an example of an electronics rack 500 that includes a leak segregation system, such as system 3, according to one embodiment. In one embodiment, the electronics rack 500 may include one or more of the same components as rack 1 (e.g., having one or more components of the leak segregation system 3), as described herein. Electronics rack 500 may include one or more server slots (e.g., that are arranged in a stack within a housing of the rack) to contain one or more electronics boards, such as electronics components (or servers), respectively. In one embodiment, each server includes one or more IT components (e.g., processors, memory, storage devices, network interfaces), which may be for providing data processing services, as described herein. According to one embodiment, electronics rack 500 includes, but is not limited to, CDU 530, rack management unit (RMU) 502 (optional), a power supply unit (PSU) 550, and one or more electronics components (or electronics boards) 507a-507d, which may be any type of IT equipment, such as server blades (e.g., that are mounted within the rack). The component 507 can be inserted into an array of server slots respectively from frontend 503 or backend 504 of electronics rack 500. In one embodiment, the electronics components may be arranged in a stack (e.g., where component 507a is positioned above 507b), as shown herein. In some embodiments, one or more of the electronics components 507a-507d may be the same as the electronics component 4, as shown in FIG. 1 (and/or FIG. 7), for example.

Note that although there are only four electronics components 507a-507d shown here, more or fewer electronics components may be maintained within electronics rack 500. Also note that the particular positions of CDU 530, RMU 502, PSU 550, and component 507 are shown for the purpose of illustration only; other arrangements or configurations of these components. may also be implemented. Note that electronics rack 500 can be either open to the environment or partially contained by a rack container, as long as the cooling fans can generate airflows from the frontend to the backend (or generate airflows from the backend to the frontend).

In addition, a fan module can be associated with each of the electronics component 507, and the PSU module. In this embodiment, fan modules 531a-531e, collectively referred to as fan modules 531, and are associated with the electronics components 507a-507d and the PSU, respectively. Each of the fan modules 531 includes one or more cooling fans.

Fan modules 531 may be mounted on the backend of component 507 to generate airflows flowing from frontend 503, traveling through the rack 500, and existing at backend 504 of electronics rack 500. In another embodiment, one or more of the fan modules may be positioned on the frontend 503 of the rack 500. Such frontend fans may be configured to push air into the mounted equipment.

In one embodiment, CDU 530 mainly includes heat exchanger 513, liquid pump 514, and a pump controller (not shown), and some other components such as a liquid reservoir, a power supply, monitoring sensors and so on. Note that CDUs can be any kind of CDUs commercially available or customized ones. Thus, the details of CDUs will not be described herein. Heat exchanger 513 may be a liquid-to-liquid heat exchanger. As shown, the heat exchanger 513 is fluidly coupled to the (e.g., main supply and return connectors (not shown) of the) rack liquid manifold 2 in order to cool liquid coolant circulating the rack liquid manifold and the pieces of electronics components 507a-507d. As described herein, each of electronics components may be coupled to manifold connectors of the rack liquid manifold 2 via one or more supply connectors and one or more return connectors.

The electronics rack 500 also includes the leak segregation structure 3, which may include one or more components of the system, described herein. Specifically, the electronics rack includes four leak segregation structures 9, each at least partially containing manifold connectors and connectors of each electronics component, in order to segregate or prevent any liquid that leaks from the connectors from spilling out into the electronics rack. In addition, the leak detection structure 10 is positioned at the bottom of the rack liquid manifold, below the leak segregation structures 9, as described herein in order to detect the presence of a leak from any of the connectors of (and coupled to) the rack liquid manifold.

As described herein, the leak detection structure may include one or more leak detection sensors 31. In one embodiment, at least some sensors may be communicatively coupled to equipment within the electronics rack, which may be configured to perform liquid detection (or mitigation) operations. For example, the sensors may be communicatively coupled with the CDU, which when receiving a control signal from the sensor that indicates a leak may perform one or more operations. For instance, the CDU may produce an alert (e.g., via a computer terminal) that indicates that a leak is present within the leak segregation system and may accurately report which connectors and/or rack liquid manifold a leak has occurred. In another embodiment, the leak detection sensor may be communicatively coupled with any electronics boards 507 or a controller (not shown) of the electronics rack that is configured to perform any of these operations.

In another embodiment, the flow of liquid into the rack liquid manifold may be adjusted based on a detected leak in order to mitigate the leak (e.g., to prevent the leak from spreading). For example, the rack liquid manifold may include one or more components that are designed to control the flow of liquid, such as one or more valves. In which case, each manifold connector may be coupled to a valve. Thus, in response to detecting a leak (e.g., at a particular manifold connector), the electronics rack may be configured to close one or more values of manifold connectors that are associated with the leak (e.g., associated with the opening at which the leak was detected).

Electronics rack 500 further includes optional RMU 502 configured to provide and manage power supplied to servers 507, fan modules 531, and CDU 530. Optimization module 521 and RMC 505 can communicate with a controller in some of the applications. RMU 502 may be coupled to PSU 550 to manage the power consumption of the PSU. The PSU 550 may include the necessary circuitry (e.g., an alternating current (AC) to direct current (DC) or DC to DC power converter, backup battery, transformer, or regulator, etc.) to provide power to the rest of the components of electronics rack 500.

In one embodiment, the (e.g., PSU 550 of the) electronics rack 500 may draw power from the AC mains to power electronics mounted therein. In another embodiment, the rack may draw power from one or more renewable power sources, such as a photovoltaic (PV) power system. In this case, the electronics rack may draw power from one or more renewable energy sources (e.g., PV systems), and supply the electronics components 507 and/or other components of the electronics rack cooling capabilities and/or perform leak detection operations, as described herein. In one embodiment, the PSU may be electrically coupled to any type of power source.

In one embodiment, RMU 502 includes optimization module 521 and rack management controller (RMC) 505. RMC 505 may include a monitor to monitor operating status of various components within electronics rack 500, such as, for example, the component 507, CDU 530, and fan modules 531. Specifically, the monitor receives operating data from various sensors representing the operating environments of electronics rack 500. For example, the monitor may receive operating data representing temperatures of the processors, cooling liquid, and airflows, which may be captured and collected via various temperature sensors. The monitor may also receive data representing the fan power and pump power generated by the fan modules 531 and liquid pump 514, which may be proportional to their respective speeds. These operating data are referred to as real-time operating data. Note that the monitor may be implemented as a separate module within RMU 505.

Based on the operating data, optimization module 521 performs an optimization using a predetermined optimization function or optimization model to derive a set of optimal fan speeds for fan modules 531 and an optimal pump speed for liquid pump 514, such that the total power consumption of liquid pump 514 and fan modules 531 reaches minimum, while the operating data associated with liquid pump 514 and cooling fans of fan modules 531 are within their respective designed specifications. Once the optimal pump speed and optimal fan speeds have been determined, RMC 505 configures liquid pump 514 and cooling fans of fan modules 531 based on the optimal pump speed and fan speeds.

As an example, based on the optimal pump speed, RMC 505 communicates with a pump controller of CDU 530 to control the speed of liquid pump 514, which in turn controls a liquid flow rate of cooling liquid supplied to the rack liquid manifold to be distributed to at least some of the component 507. Therefore, the operating condition and the corresponding cooling device performance are adjusted. Similarly, based on the optimal fan speeds, RMC 505 communicates with each of the fan modules 531 to control the speed of each cooling fan of the fan modules 531, which in turn control the airflow rates of the fan modules 531. Note that each of fan modules 531 may be individually controlled with its specific optimal fan speed, and different fan modules and/or different cooling fans within the same fan module may have different optimal fan speeds.

Note that some or all of the component 507 may utilize different cooling methods. For instance, one server may utilize air cooling while another server may utilize liquid cooling. Alternatively, one IT component of a server may utilize air cooling while another IT component of the same server may utilize liquid cooling (e.g., via one or more cold plates that are fluidly coupled to the rack liquid manifold, as described herein).

Figure 7:
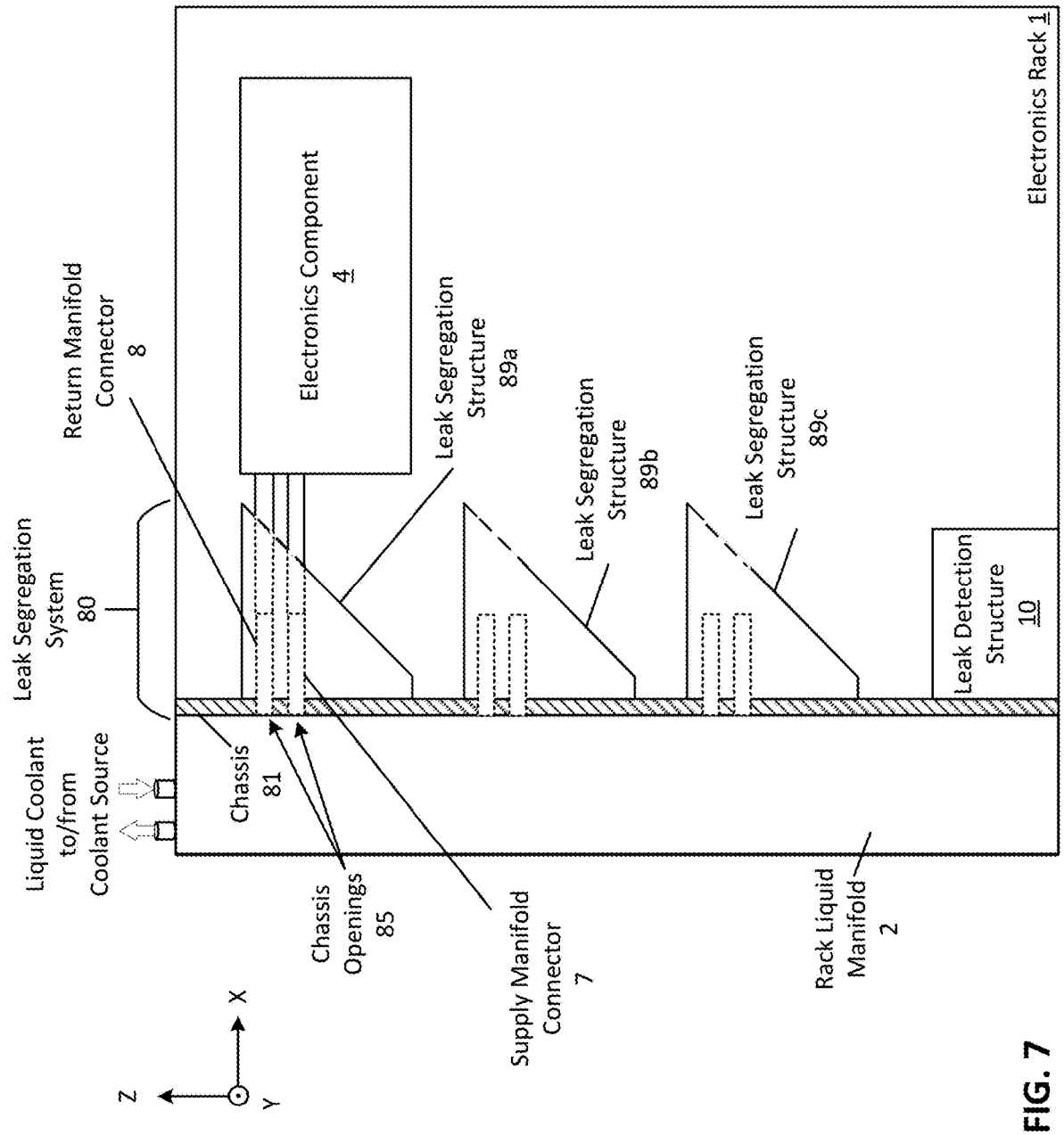
FIG. 7 shows a side view of a leak segregation system according to another embodiment.

FIG. 7 shows a side view of a leak segregation system according to another embodiment. Specifically, this figure shows the electronics rack 1 that includes the rack liquid manifold 2, an electronics component 4 coupled to the manifold (e.g., via the supply and return manifold connectors 7 and 8), and a leak segregation system 80. Although not illustrated, the rack liquid manifold may include supply and return manifolds 5 and 6, and the electronics component may include one or more IT components 14 and one or more cold plates 15, as shown in FIG. 1.

In one embodiment, the leak segregation system 80 may be similar to system 3, in which both systems include one or more leak segregation structures and one or more leak detection structures 10. Specifically, the system includes leak segregation structures 89a-89c (or hereafter each of which being referred to as "leak segregation structure 89"), which may be similar (or the same as structures 9a-9c, as illustrated in FIG. 1). In one embodiment, the structure 89 may differ from the structure 9, in which structure 89 does not includes extending arms 29 and 30, as shown in FIG. 2. The system 80 does, however, include one or more additional components. In this case, the system 80 includes a chassis 81 that is coupled to the rack liquid manifold 2. Specifically, the chassis may be a (e.g., single) frame or plate that is (e.g., removably) mounted to the (e.g., front surface 16) of the rack liquid manifold. The chassis includes one or more chassis openings 85, each opening for receiving one or more manifold connectors of the rack liquid manifold. For example, when mounting the chassis to the rack liquid manifold, the chassis may be positioned such that the manifold connectors are aligned with respective chassis openings 85. Once aligned, the chassis may be pushed towards the front surface of the rack liquid manifold (e.g., along the X-axis), allowing manifold connectors to enter their respective chassis openings.

In one embodiment, the chassis may be one or more back plates that are arranged to be coupled to the front surface of the rack liquid manifold 16. In which case, leaking liquid may travel (or run) along (a front surface of) the chassis, rather than on the front surface of the rack liquid manifold. In some embodiments, liquid may still run along (at least a portion of) the front surface of the rack liquid manifold. In another embodiment, the chassis 81 may be a part of the rack liquid manifold 2. In particular, the chassis may be fixedly coupled to (or be a part of) the rack liquid manifold. In some embodiments, In one embodiment, the chassis 81 may be arranged such that leak segregation structures may be removably coupled. In particular, as shown, the leak segregation structures do not include the extended arms 29 and 30 (as shown in FIG. 2, for example). Instead, the leak segregation structures (or more specifically the sides 24 and 25 of the structures) may couple to the chassis, such that one or more manifold connectors may be contained within the structures.

Figure 8:
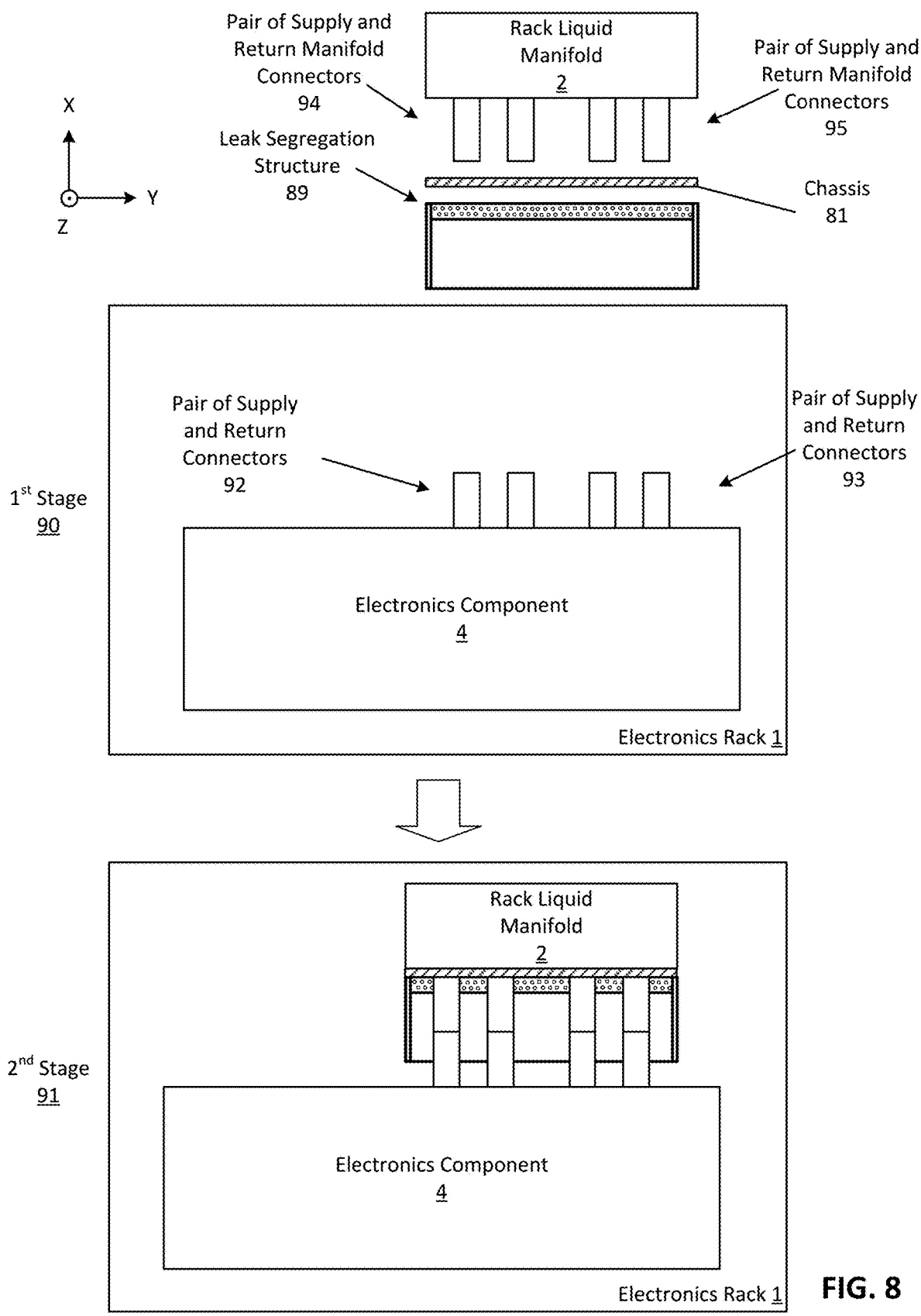
FIG. 8 shows several stages of a top view of the leak segregation system of FIG. 8 being coupled to a rack liquid manifold that is also being coupled to an electronics component according to another embodiment.

FIG. 8 shows several stages 90 and 91 of a top view of the leak segregation system of FIG. 7 being coupled to a rack liquid manifold that is also being coupled to a electronics component according to another embodiment. For instance, stage 90 shows a top-down view of the rack liquid manifold 2, the chassis 81 and the leak segregation structure 89 of the system 80, and the electronics component 4. Thus, as shown, each of these components may be removably coupled to one another, as described herein.

In this example, the rack liquid manifold and the electronics component include several pairs of connectors. For example, the manifold includes two pairs of supply and return manifold connectors 94 and 95, while the component includes two pairs of supply and return connectors 92 and 93. In one embodiment, the manifold (and/or component) may include more or less pairs of connectors. More about the pairs of connectors is described herein.

The second stage 91 shows that the chassis 81 has been coupled to the rack liquid manifold, the leak segregation structure 89 has been coupled to the chassis, and the pairs of connectors 92 and 93 of the electronics component have been coupled to the manifold connectors 94 and 95, respectively. As a result, the leak segregation structure contains the pairs of manifold connectors and at least partially contains the pairs of connectors of the electronics component.

In one embodiment, the electronics component may have multiple pairs of connectors, where at least one of the pairs is a redundant pair of connectors, which may be used based on one or more criteria. For example, both connectors may be arranged to couple one or more cold plates (within the electronics component) with the rack liquid manifold. In the case in which a leak may occur in one from one of the connectors, the flow of liquid through the pair of connectors that are affected by the leak may shut off (e.g., using one or more valves), while the other pair of connectors are used to continue the flow of liquid. In another embodiment, the connectors may be used simultaneously to provide liquid coolant.

As previously explained, an embodiment of the disclosure may be (or include) a non-transitory machine-readable medium (such as microelectronic memory) having stored thereon instructions, which program one or more data processing components (generically referred to here as a "processor") to perform liquid detection operations, as described herein. In other embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain embodiments have been described and shown in the accompanying drawings, it is to be understood that such embodiments are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some embodiments, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B,"

or "at least of either A or B." In some embodiments, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A leak segregation system for an electronics rack that includes a rack liquid manifold, the leak segregation system comprising:
a leak segregation structure that is removably mounted to the rack liquid manifold, the leak segregation structure having
a top opening,
a bottom that includes an opening,
a back opening for receiving a first connector of the rack liquid manifold, and
a front opening for receiving a second connector of an electronics component mounted within the electronics rack, the leak segregation structure extends from a front surface of the rack liquid manifold such that the leak segregation structure contains the first connector of the rack liquid manifold and at least partially contains the second connector when the first and second connectors are received through their respective openings and are coupled together; and
a leak detection structure that is positioned below the leak segregation structure, the leak detection structure having a leak detection sensor that is configured to detect a presence of liquid from the leak segregation structure.

2. The leak segregation system of claim 1, wherein the bottom tapers along a vertical axis that runs through the leak segregation structure towards the opening.

3. The leak segregation system of claim 1, wherein the leak segregation structure includes a front side that tapers along a vertical axis that runs through the leak segregation structure and away from the front opening of the leak segregation structure.

4. The leak segregation system of claim 1, wherein the leak segregation structure further comprises a first extending arm and a second extending arm that extend in a direction that is opposite from the front opening, wherein the first and second extending arms are arranged to couple to the rack liquid manifold to mount the leak segregation structure to the rack liquid manifold.

5. The leak segregation system of claim 1, wherein the leak detection structure comprises a converging channel that includes a top portion that tapers inward and towards a center vertical channel that is arranged to house a leak detection cable that is communicatively coupled to the leak detection sensor.

6. The leak segregation system of claim 1,
wherein the leak segregation structure is one of a first plurality of leak segregation structures that are removably mounted to the rack liquid manifold and are arranged in a stack above the leak detection structure, and
wherein the rack liquid manifold comprises a supply rack liquid manifold that receives liquid from a coolant source and to which the first plurality of leak segregation structures are removably mounted, and a return rack liquid manifold that returns liquid to the coolant source and to which a second plurality of leak segregation structures are removably mounted in a stack.

7. The leak segregation system of claim 6, wherein leak segregation structures from the first and second pluralities of leak segregation structures are paired, each pair having a first leak segregation structure from the first plurality of leak segregation structures and a second leak segregation structure from the second plurality of leak segregation structures, and, for each pair, the first leak segregation structure is arranged to contain a supply manifold connector that is coupled to the supply rack liquid manifold and the second leak segregation structure is arranged to contain a return manifold connector that is coupled to the return rack liquid manifold.

8. The leak segregation system of claim 7,
wherein the leak detection structure is a first leak detection structure that is positioned below the first plurality of leak segregation structures and the leak detection sensor is a first leak detection sensor that is configured to detect the presence of liquid from any of the first plurality of leak segregation structures, and
wherein the leak segregation system further comprises a second leak detection structure that is positioned below the second plurality of leak segregation structures, and has a second leak detection sensor that is configured to detect a presence of liquid from any of the second plurality of leak segregation structures.

9. The leak segregation system of claim 7, wherein the leak detection structure is positioned below the plurality of pairs of leak segregation structures, wherein the leak detection sensor is configured to detect a presence of liquid from any of the leak segregation structures of the first and second plurality of leak segregation structures.

10. The leak segregation system of claim 1,
wherein the first connector is a supply manifold connector of the rack liquid manifold and the second connector is a supply connector of the electronics component, and
wherein the back opening is for receiving the supply manifold connector and a return manifold connector of the rack liquid manifold such that the leak segregation structure contains both connectors.

11. The leak segregation system of claim 10, wherein the front opening is for receiving the supply connector and a return connector of the electronics component such that the leak segregation structure at least partially contains both the supply and return connectors when received through the front opening and coupled to the supply and return manifold connectors, respectively.

12. The leak segregation system of claim 1, wherein the leak detection structure is coupled to and is positioned at a bottom of the rack liquid manifold.

13. An electronics rack comprising:
an electronics component mounted within the electronic rack for providing data processing services;
a rack liquid manifold; and
a leak segregation system that is coupled to the rack liquid manifold, the leak segregation system comprising:
a leak segregation structure that is removably mounted to the rack liquid manifold, the leak segregation structure having
a top opening,
a bottom that includes an opening,
a back opening for receiving a first connector of the rack liquid manifold, and
a front opening for receiving a second connector of the electronics component, the leak segregation structure extends from a front surface of the rack liquid manifold such that the leak segregation structure contains the first connector and at least partially contains the second connector when the first and second connectors are coupled together, and a leak detection structure that is positioned below the leak segregation structure, the leak detection structure having a leak detection sensor that is configured to detect a presence of liquid from the leak segregation structure.

14. The electronics rack of claim 11, wherein the bottom tapers along a vertical axis that runs through the leak segregation structure towards the opening.

15. The electronics rack of claim 11, wherein the leak segregation structure includes a front side that tapers along a vertical axis that runs through the leak segregation structure and away from the front opening of the leak segregation structure.

16. The electronics rack of claim 11, wherein the leak segregation structure further comprises a first extending arm and a second extending arm that both extend in a direction that is opposite from the front opening, wherein the first and second extending arms are arranged to couple to the rack liquid manifold to mount the leak segregation structure to the rack liquid manifold.

17. The electronics rack of claim 11, wherein the leak detection structure comprises a converging channel that includes a top portion that tapers inward and towards a center vertical channel that is arranged to house a leak detection cable that is communicatively coupled to the leak detection sensor.

18. The electronics rack of claim 11,
wherein the leak segregation structure is one of a first plurality of leak segregation structures that are removably mounted to the rack liquid manifold and are arranged in a stack above the leak detection structure,
wherein the rack liquid manifold comprises a supply rack liquid manifold that receives liquid from a coolant source and to which the first plurality of leak segregation structures are removably mounted, and a return rack liquid manifold that returns liquid to the coolant source and to which a second plurality of leak segregation structures are removably mounted in a stack.

19. The electronics rack of claim 18, wherein leak segregation structures from the first and second pluralities of leak segregation structures are paired, each pair having a first leak segregation structure from the first plurality of leak segregation structures and a second leak segregation structure from the second plurality of leak segregation structures, and, for each pair, the first leak segregation structure is arranged to contain a supply manifold connector that is coupled to the supply rack liquid manifold and the second leak segregation structure is arranged to contain a return manifold connector that is coupled to the return liquid manifold.

20. A leak segregation system for an electronics rack that includes a rack liquid manifold, the leak segregation system comprising:
a chassis that is coupled to the rack liquid manifold, the chassis comprising a plurality of openings, each opening for receiving a first connector of the rack liquid manifold;
a plurality of leak segregation structures that are mounted to the chassis and are arranged in a stack, each leak segregation structure at least partially surrounding a respective first connector of the rack liquid manifold that has been received by a respective opening of the plurality of openings, each leak segregation structure having:
a top opening,
a bottom that includes at least one opening, and
a front opening for receiving at least a portion of a second connector of an electronics component mounted within the electronics rack when the second connector and the respective first connector are coupled together; and
a leak detection structure that is mounted to the chassis and is positioned below the stack of leak segregation structures, the leak detection structure having a leak detection sensor that is configured to detect a presence of liquid from any of the plurality of leak segregation structures.

\* \* \* \* \*